(12) United States Patent
Gruber et al.

(10) Patent No.: US 8,735,262 B2
(45) Date of Patent: May 27, 2014

(54) SEMICONDUCTOR DEVICE HAVING A THROUGH CONTACT AND A MANUFACTURING METHOD THEREFOR

(75) Inventors: Hermann Gruber, Woerth an der Donau (DE); Thomas Gross, Sinzing (DE); Andreas Peter Meiser, Sauerlach (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/279,846

(22) Filed: Oct. 24, 2011

(65) Prior Publication Data

US 2013/0099308 A1     Apr. 25, 2013

(51) Int. Cl.
*H01L 21/301*     (2006.01)
*H01L 21/00*     (2006.01)

(52) U.S. Cl.
USPC ........... 438/458; 438/667; 438/464; 438/406; 257/E21.597; 257/E23.011

(58) Field of Classification Search
USPC ................................ 438/464, 406
See application file for complete search history.

(56) References Cited

U.S. PATENT DOCUMENTS

| | | | |
|---|---|---|---|
| 7,374,972 B2 | 5/2008 | Kwon et al. | |
| 7,662,670 B2 | 2/2010 | Noma et al. | |
| 7,867,879 B2 | 1/2011 | Weber et al. | |
| 8,420,445 B2* | 4/2013 | Leib | 438/113 |
| 2009/0065904 A1* | 3/2009 | Wang | 257/621 |
| 2009/0130846 A1* | 5/2009 | Mistuhashi | 438/667 |

OTHER PUBLICATIONS

Puech, M. et al. "Fabrication of 3D Packaging TSV using DRIE", Mar. 2007, Alcatel Micro Machining Systems, Annecy, France.

* cited by examiner

*Primary Examiner* — Matthew W Such
*Assistant Examiner* — Scott Stowe
(74) *Attorney, Agent, or Firm* — Murphy, Bilak & Homiller, PLLC

(57) ABSTRACT

According to an embodiment, a method of forming a semiconductor device includes: providing a wafer having a semiconductor substrate with a first side a second side opposite the first side, and a dielectric region arranged on the first side; mounting the wafer with the first side on a carrier system; etching a deep vertical trench from the second side through the semiconductor substrate to the dielectric region, thereby insulating a mesa region from the remaining semiconductor substrate; and filling the deep vertical trench with a dielectric material.

19 Claims, 17 Drawing Sheets

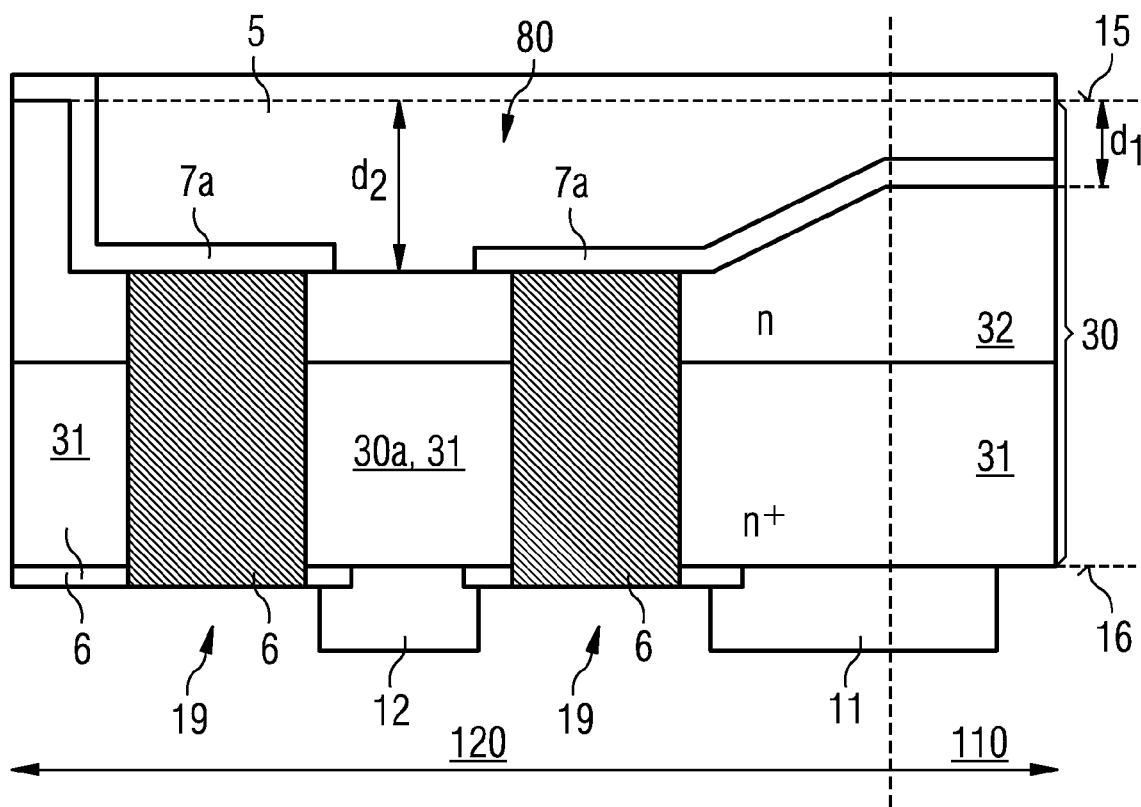

SEMICONDUCTOR DEVICE HAVING A THROUGH CONTACT AND A MANUFACTURING METHOD THEREFOR

TECHNICAL FIELD

Embodiments described herein relate to semiconductor devices and methods of forming semiconductor devices, in particular to semiconductor transistors and methods of forming semiconductor transistors with a semiconductor substrate having a semiconductor via region between a first side and a second side of the semiconductor substrate for connecting a control electrode of the semiconductor transistor.

BACKGROUND

Many functions of modern devices in automotive, consumer and industrial applications, such as computer technology, mobile communications technology, converting electrical energy and driving an electric motor or an electric machine, rely on semiconductor devices, in particular semiconductor transistors such as field-effect transistors (FETs), for example power MOSFETs (Metal Oxide Semiconductor Field-Effect Transistors).

In many applications, vertical MOSFETs with a source metallization and a gate metallization on the front side of the semiconductor substrate, and a drain metallization on the back side of the semiconductor substrate are used. There are, however, applications in which it is desirable for the source metallization of the MOSFET to be located on the front side of its semiconductor substrate whereas the gate metallization and the drain metallization are located on the back side of the semiconductor substrate. Such a device is in the following referred to as source-down MOSFET because the MOSFET can be soldered up-side down with its front side (source metallization is directed downwardly) to a simple lead frame. Thereby, additional costs for a segmented lead frame may be avoided. Furthermore, source-down MOSFETs may particularly efficiently be cooled through the source metallization which is close to the channel region. Further, in application in which the source metallization is during operation at reference potential, typically at ground, no further insulation of the source-down MOSFET may be required. This makes source-down MOSFETs particularly interesting for automotive applications in which the lead frame to which the source metallization of the MOSFET is soldered or glued may simply be mounted or connected to the chassis at ground potential.

For source-down MOSFETs, a conductive via through the semiconductor substrate is typically formed to connect the gate metallization and a gate electrode of the MOSFET. Furthermore, sufficiently reliable electrically insulating regions, for example thermal oxides, are often desired on top and bottom side of the semiconductor substrate, in particular for power semiconductor devices. However, forming of sufficiently reliable insulating thermal oxides typically requires higher temperatures and thus poses limits for the manufacturing. Accordingly, the manufacturing of such devices is often complex and/or expensive. Alternatively, insulated deep vertical trenches may be formed in an early process from the source-side into the wafer to define via regions. Thereafter, the source side may be finished and the wafer thinned at the opposite site, thereby exposing the insulated deep vertical trenches and forming the via regions. This manufacturing method is, however, also expensive. In addition, mechanical stability of the wafer may be weakened when the insulated deep vertical trenches are not completely filled. This may result in wafer breaking during processing.

SUMMARY

According to one or more embodiments, a method of forming a semiconductor device includes: providing a wafer having a semiconductor substrate with a first side, a second side opposite the first side, and a dielectric region on the first side; etching a deep vertical trench from the second side through the semiconductor substrate to the dielectric region, thereby insulating a mesa region from the remaining semiconductor substrate; and filling the deep vertical trench with a dielectric material.

According to one or more embodiments, a method of forming a plurality semiconductor devices includes: providing a wafer having a semiconductor substrate with a plurality of semiconductor structures; forming a common metallization for the plurality of semiconductor structures on the wafer; mounting the wafer on a carrier system so that the common metallization is covered by the carrier system; forming separation trenches through the semiconductor substrate of the mounted wafer and between the plurality of semiconductor structures; and separating the plurality of semiconductor structures along the separation trenches.

According to one or more embodiments, a semiconductor device includes: a semiconductor substrate having a first side, a second side opposite the first side, an active area with a transistor structure having a control electrode, and a through contact area with a semiconductor mesa having insulated sidewalls; a first metallization on the first side in the active area; a recess extending from the first side into the semiconductor substrate and between the active area and the through contact area; and a control metallization on the second side and in ohmic contact with the semiconductor mesa. The recess has in the through contact area a horizontally widening portion and is at least partly filled with a conductive material in ohmic contact with the semiconductor mesa and the transistor structure.

According to one or more embodiments, a method of forming a semiconductor device includes: providing a semiconductor substrate having a first side and a second side opposite the first side; defining an active area and a through contact area; forming a recess from the first side into the semiconductor substrate such that the recess comprises in the through contact area a horizontally widening portion; forming a first dielectric layer on the recess; opening the first dielectric layer in the through contact area; mounting the semiconductor substrate on a carrier system; etching in the through contact area from the second side two deep circumferential vertical trenches through the semiconductor substrate to the first dielectric layer; and insulating at least the sidewalls of the two deep circumferential vertical trenches to form a laterally insulated semiconductor mesa.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 6 illustrates, in a vertical cross-section, a semiconductor device according to an embodiment.

DETAILED DESCRIPTION

Figure 1:
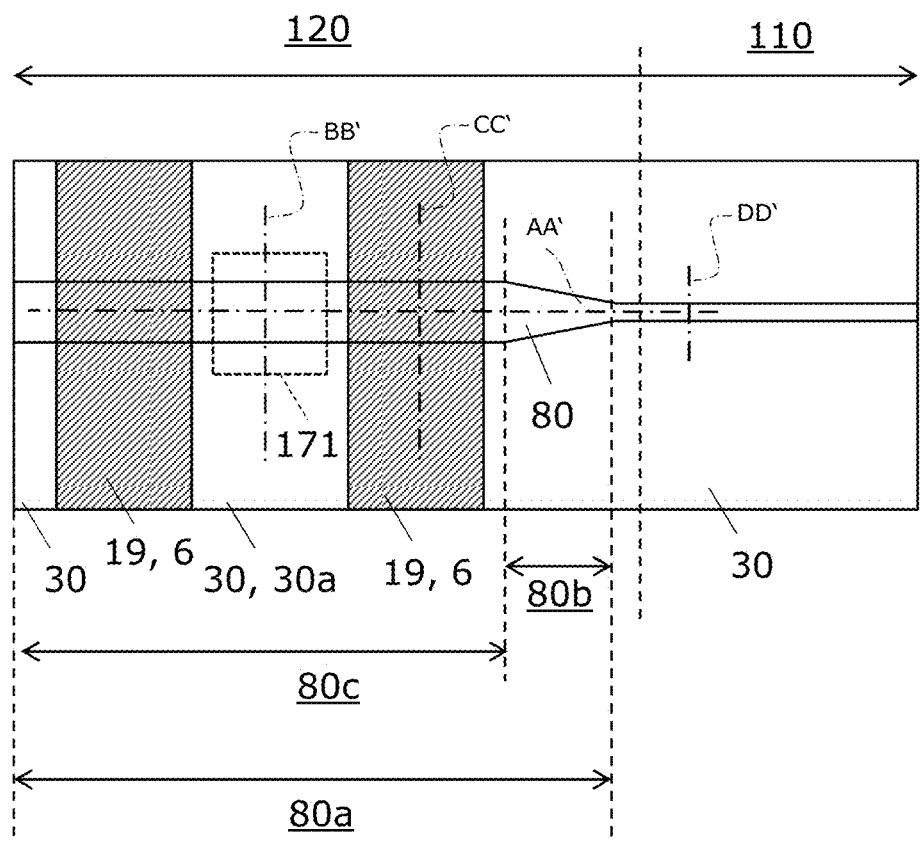
FIG. 1 illustrates, in a plane view, a semiconductor device according to an embodiment.

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

When referring to semiconductor devices, at least two-terminal devices are meant, an example is a diode. Semiconductor devices can also be three-terminal devices such as a field-effect transistors (FET) such as a MOSFET or an insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Specific embodiments described in this specification pertain to, without being limited thereto, semiconductor devices and manufacturing methods therefore, in particular to three terminal semiconductor transistors such as MOSFETs, IGBTs and BJTs (Bipolar Junction Transistors). The semiconductor devices are typically vertical power semiconductor devices.

The term "power semiconductor device" as used in this specification intends to describe a semiconductor device on a single chip with high voltage and/or high current switching capabilities. In other words, power semiconductor devices are intended for high current, typically in the Ampere range, and/or voltages above 10 V, more typically above 20 V.

In the context of the present specification, the terms "in ohmic contact" and "in contact" intends to describe that there is an ohmic electric connection or ohmic current path between two regions, portion or parts of a semiconductor device through the semiconductor device or between different electrodes of one or more devices or between a electrode or a metallization and a portion or a part of the semiconductor device. In the context of the present specification, the terms "low ohmic current path" and "low resistive current path" are used synonymously. Further, the terms "low ohmic contact" and "low resistive contact" are used synonymously in the context of the present specification.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of a metal such as Al, Cu, W, Ti, Au, Ag, Ni, V, Sn and Co but may also be made of a material with metallic or near metallic properties with respect to electric conductivity such as highly doped n-type or p-type poly-Si (poly-silicon), TiN or an electrically conductive silicide such as $WSi_2$. The metallization may also include different electrically conductive materials, for ex-ample a stack of those materials.

In the following, embodiments pertaining to semiconductor devices are explained mainly with reference to silicon (Si)

semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples include elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semi-conductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a wide band-gap material such as SiC or GaN which has a high breakdown field strength and high critical avalanche field strength, respectively, the doping of the respective semiconductor regions can be chosen higher which reduces the on-resistance Ron. Furthermore, the leakage current across pn-junctions formed in wide band-gap materials is often negligible. The term "wide band-gap semiconductor material" as used in this specification intends to describe a semiconductor material with an electronic band-gap of about at least two electron volts (eV).

With reference to FIG. 1, a first embodiment of a semiconductor device 105 is described. FIG. 1 corresponds to a general layout and a schematic plane view on a first side or first surface of a semiconductor substrate 30 of semiconductor device 105. Typically, a first metallization, for example a source metallization, is arranged on the first side. The first metallization may substantially cover the first side. In the following the first metallization is therefore also referred to as common metallization. For sake of clarity, the common metallization as well as any contact structures formed between the common metallization to the semiconductor substrate 30 are not shown in FIG. 1. Briefly, the semiconductor device 105 has an active area 110 and a through contact area 120. The active area 110 includes a transistor structure in contact with the common metallization and a third or back metallization (not shown in FIG. 1) for feeding a load current to the transistor structure. Further, the transistor structure has a control electrode, for example an insulated gate electrode, which is however also not shown in FIG. 1. Typically, the active area 110 includes a plurality of transistor structures, for example MOSFETS and/or IGBTs, to provide high current and/or high voltage switching capability of the semiconductor device 105. The through contact area 120 includes a sufficiently low resistive semiconductor mesa 30a which is laterally insulated from other parts of the semiconductor substrate 30 to form a through contact for contacting the control electrode to a control metallization which is arranged on the second side. In the following the control metallization is also referred to as second metallization.

In the exemplary embodiment, the semiconductor mesa 30a is laterally insulated by two deep vertical trenches 19 which extend through the semiconductor substrate 30 and are filled with a dielectric material 6. The two deep vertical trenches 19 may, however, also correspond to two portions of a connected deep vertical trench 19 which circumferentially surrounds, in plane view and vertical cross-sections, the semiconductor mesa 30a. In this embodiment, the semiconductor mesa 30a is substantially formed as a plug.

According to an embodiment, a recess or indentation 80 extends from the first side into semiconductor substrate 30. The recess 80 extends between the active area 110 and the through contact area 120 and is at least partially filled with a conductive material, for example poly-Si, in ohmic contact with the semiconductor mesa 30a and the control electrode of the transistor structure. Accordingly, the control electrode is contacted through the semiconductor substrate 30 to the control metallization.

In the exemplary embodiment, the recess 80 includes a horizontally widening portion 80b and a horizontally widened portion 80c. As will be explained below in more detail, this facilitates manufacturing of the semiconductor device 105.

In the exemplary embodiment, the horizontally widening portion 80b is arranged between the right deep vertical trench 19 and active area 110. This is, however, only an example. The horizontally widening portion 80b may also be partly or completely arranged on the right vertical trench 19 and/or on the semiconductor mesa 30a.

Likewise, the extension 80a of the recess 80 to the left side of the semiconductor device 105 may differ from the illustrated one. For example, the recess 80 may, in a horizontal direction, only extend from the active area 110 to a horizontal position on the left deep vertical trench 19.

In addition, an opening 171 of an insulating layer (not shown in FIG. 1) arranged on the semiconductor substrate 30 is illustrated in FIG. 1. The opening 171 overlaps the recess 80 above the semiconductor mesa 30a so that a low ohmic contact between the semiconductor mesa 30a and the conductive material arranged thereon is provided for contacting the control electrode.

Figure 2:
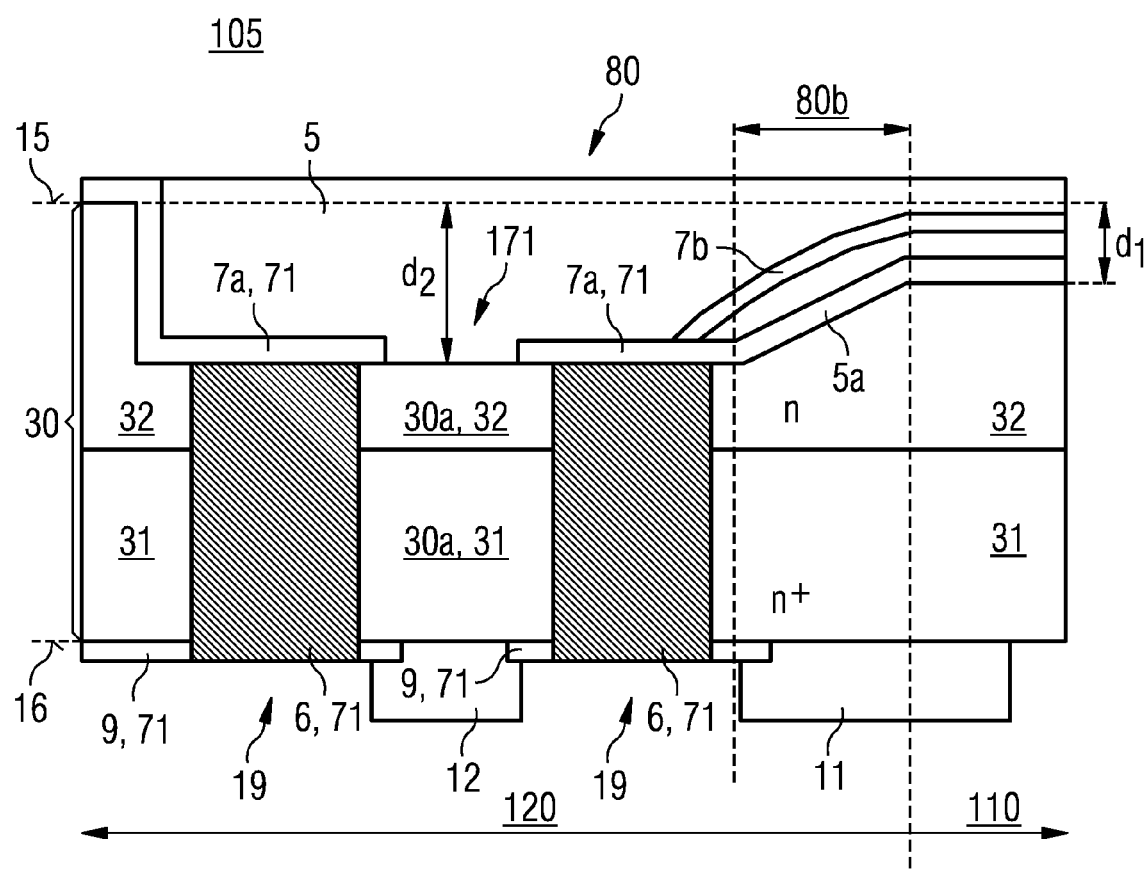
FIG. 2 illustrates, in a vertical cross-section, a semiconductor device according to an embodiment.

With reference to FIG. 2, a further embodiment will be described. FIG. 2 corresponds to a vertical cross-section through the semiconductor device 105 along line AA' of FIG. 1. If not stated otherwise, a first side 15 of the semiconductor substrate 30 is orientated in the Figures illustrating vertical cross-sections to the top while a second opposing side 16 of the semiconductor substrate 30 is orientated to the bottom.

In the exemplary embodiment, the semiconductor substrate 30 includes a common substrate 31, for example a highly n-doped common substrate 31, and an epitaxial layer 32, for example an n-doped epitaxial layer 32. Accordingly, the semiconductor device 105 may, for example, form an n-channel MOSFET. The doping relations may, however, also be reversed so that the semiconductor device 105 may form a p-channel MOSFET. Even further, the common substrate 31 may be p-doped and the epitaxial layer 32 n-doped. In this embodiment, the semiconductor device 105 may form an n-channel IGBT, a BJT or a thyristor.

In the exemplary embodiment, an insulating structure 71 laterally insulates the semiconductor mesa 30a from adjacent semiconductor regions of the semiconductor substrate 30.

The insulating structure 71 is formed by dielectrically filled deep vertical trenches 19 extending through the semiconductor substrate 30, a first dielectric layer 7a, which is arranged on the bottom of the recess 80, and a dielectric layer 9 arranged on the second side 16. The dielectric layer 9 arranged on the second side 16 may also extend along the side walls of the deep vertical trenches 19. In this embodiment, the residual vertical trench may be filled with a polymer or any other dielectric material.

According to an embodiment, the recess 80 extends in the active area 110 to a first vertical depth d1 and in the through contact area 120 to a second vertical depth d2 which is larger than the first vertical depth. This facilitates manufacturing of the semiconductor device 105.

As explained with reference to FIG. 1, the recess 80 is filled with a first conductive material 5, typically poly-Si, forming a first conductive region 5 for contacting a control electrode, for example an insulated gate electrode, of the transistor structure formed in the active area 110 (not shown in FIG. 2). The first conductive region 5 fills the opening 171 of the first dielectric layer 7a so that a low ohmic contact between the semiconductor mesa 30a and the first conductive region 5 is provided. Accordingly, the first conductive region 5 forms a control wiring in the illustrated section of the semiconductor device 105.

A third metallization 11 and a control metallization 12 are arranged on the second side 16. The third metallization 11 is in ohmic contact with the common substrate 31 in the active area 110 and may, for example, form a drain electrode of a MOSFET and a collector electrode of an IGBT, respectively. The control or gate metallization 12 is arranged on the semiconductor mesa 30a. Accordingly, a control electrode arranged next to the first side 15 is contacted to a control metallization 12 arranged on the second side 16 via the semiconductor mesa 30a.

Typically, the recess 80 further includes a second conductive region 5a, typically also made of highly doped poly-Si, which is arranged below and insulated from the first conductive region 5 by a dielectric region 7b adjoining the dielectric region 7a. The dielectric regions 7a, 7b are typically made of silicon oxide, for example formed by thermal oxidation and/or deposition. The dielectric regions 7a, 7b may however also be made of other dielectric materials, for example silicon nitride, or formed by layers of different dielectric materials. In the active area 110, the first conductive region 5 and the second conductive region 5a typically form a field electrode and a gate electrode. This is explained in more detail in the following.

Figure 3:
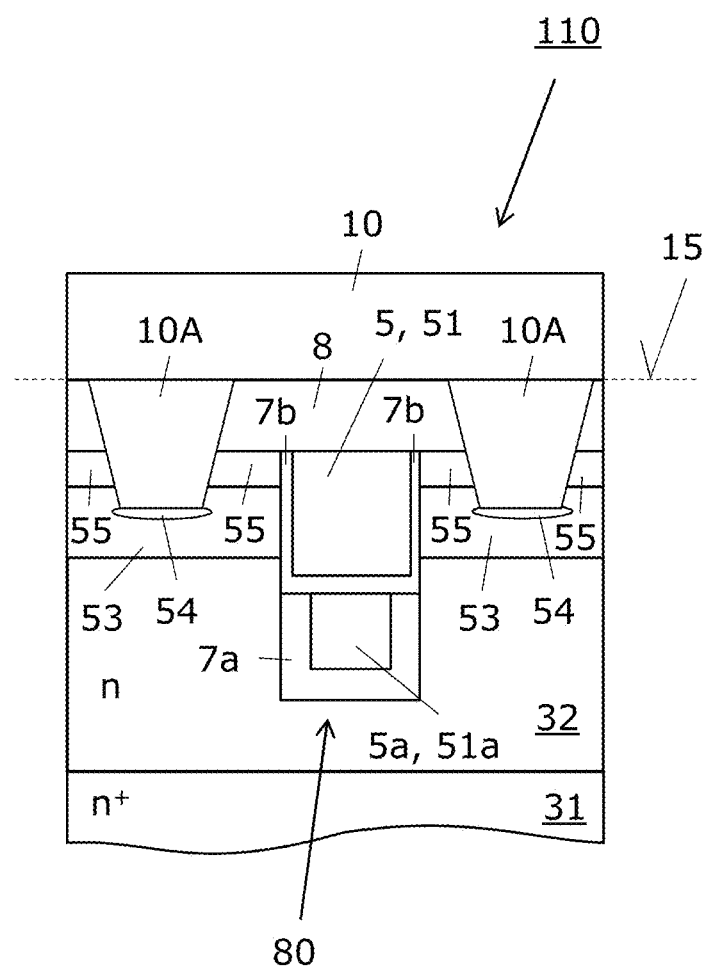
FIG. 3 illustrates, in a vertical cross-section, a semiconductor device according to an embodiment.

FIG. 3 corresponds to a vertical cross-section through the semiconductor device 105 along line DD' of FIG. 1, i.e. to a section through the active area 110 of the semiconductor device 105. In the exemplary embodiment, the semiconductor device 105 includes a MOSFET-structure, in particular a trench MOSFET-structure, in the active area 110. The recess 80 forms in the active area 110 a trench 80 which includes a field plate 51a formed by a portion of the second conductive region 5a, a field oxide or field dielectric 7a formed by a portion of the dielectric region 7a, a gate electrode 51 formed by a portion of the first conductive region 5a and a gate oxide or gate dielectric 7b formed by a portion of the dielectric region 7b illustrated in FIG. 2. The gate dielectric 7b extends along the sidewalls of the trench 80 between an n⁺-type source region 55 and an n-type drift region 32 formed by a portion of the epitaxial layer 32. Between the source region 55 and the drift region 32 a p-type body region 53 is arranged. The source region 55 and the body region 53 are in ohmic contact with a source electrode 10 arranged on the first side 15 through a conductive plug 10A and a p⁺-type body contact region 54. The conductive plug 10A extends through a dielectric interlayer 8 insulating the source metallization 10 from the gate electrode 51 and the gate wiring 5, respectively. By appropriately biasing the gate electrode 51 and the source metallization 10, a conductive channel may be formed in the body region 53 along the gate dielectric 7b and between the source region 55 and the drift region 32. Typically, the field plate 51 is also connected to the source electrode 10 to increase blocking capability of the semiconductor device 105.

For manufacturing the semiconductor device 105, the semiconductor substrate 30 is typically first completely processed from the first side 15. Thereafter, the deep vertical trenches 19 are etched from the second side 16 and filled with a dielectric material 6, 9. In doing so, forming through contacts from the second side 16 may be performed without additional higher temperature loads influencing the transistor characteristics.

More particularly, after providing a semiconductor substrate 30, an active area 110 and a through contact area 120 are defined. Thereafter, a trench or recess 80 is etched on the first side 15 into the semiconductor substrate 30 so that the recess 80 has a horizontally widening portion in the through contact area 120. This is typically achieved by etching using a mask with a corresponding horizontal widening. Due to the widening of the mask, the recess 80 is also etched deeper into the semiconductor substrate 30 in the through contact area 120 compared to the active area 110.

Thereafter, a field dielectric layer 7a is formed by deposition and/or thermal oxidation. A conductive material such as poly-Si is typically deposited as a conformal layer 5a on the field dielectric layer 7a in the recess 80. In a subsequent back etching process, using for example isotropic etching, the conductive material 5a is completely removed in the horizontally widened portion of the recess 80 while a bottom portion of the recess 80 remains filled in the active area 110. Accordingly, a field electrode 51a is formed. As an example, the recess 80 may have a width of about 700-800 nm in the active area 110 that widens two times or more, for example to about 1.5 mm in through the contact area 120. The widening is typically determined such that the widened portion of the recess 80 is conformal lined with the deposited poly-Si. For example, the widening is determined by twice the thickness of deposited poly-Si and a safety margin of for example 500 nm.

Thereafter, the field dielectric layer 7a may partly be removed in the active area 110 and a gate oxide 7b is formed. Optionally, a HDP-oxide (high density plasma) may be formed on the field electrode 51a. In the through contact area 120, the field oxide layer 7a is opened using a photo mask in a region 171 to expose the semiconductor substrate 30 in a portion later forming a through contact 30a, as illustrated in FIG. 1. The photo mask has typically a vertical thickness of about 5 μm to about 10 μm. Through the photo mask, an optional implantation may be performed to reduce resistivity of the later formed through contact 30a in its epitaxial portion.

Thereafter, a second conductive region 5 is formed on the first side 15, for example by deposition of poly-Si, an optional CMP (chemical-mechanical polishing) process and back etching of the poly-Si to form a gate electrode 51 in the active area 110 and a control wiring 5 in contact with the later formed through contact 32a in the through contact area 120.

Thereafter, the body region 53 and the source region 55 may be formed, for example by implantation and subsequent drive-in. After depositing the dielectric interlayer 8, shallow contact trenches are typically formed in the active area 120 that are filled with the conductive plugs 10A, for example poly-Si plugs or wolfram-plugs. Prior to forming the conductive plugs 10A, a body contact region 54 may be formed by implantation and subsequent drive-in.

Thereafter, a source metallization 10 is formed on the first side 15. Now, semiconductor the substrate 30 may be mounted with the source metallization 10 on a carrier system, for example a glass-wafer. The mounted semiconductor substrate 30 may be suitably thinned at the second side 16.

In the trough contact area 120, the deep vertical trenches 19 are etched from the second side 16 through the semiconductor substrate 30 to the field dielectric layer 7a. Typically, the deep vertical trenches 19 are about 5 μm to 40 μm wide, for example about 20 μm wide, and circumferentially surround the active area 110 in plane view. To ensure that the etch process used for forming the deep vertical trenches 19 stops at the field dielectric layer 7a, enough space, for example 10 μm or more, of the widening of the recess 80 is provided to take into account alignment accuracy and accuracy of the etching process.

Thereafter, the deep vertical trenches 19 are filled with a dielectric material 6 for example an epoxy resin and/or with an oxide using a low temperature oxide-CVD-process. In so doing, a laterally insulated semiconductor mesa 30a is formed as a through contact onto which a control metallization 12 is subsequently formed. Typically, the control metallization 12 and a drain metallization 11 in ohmic contact with the drift region are formed using a common deposition and a subsequent structuring process.

Figure 4:
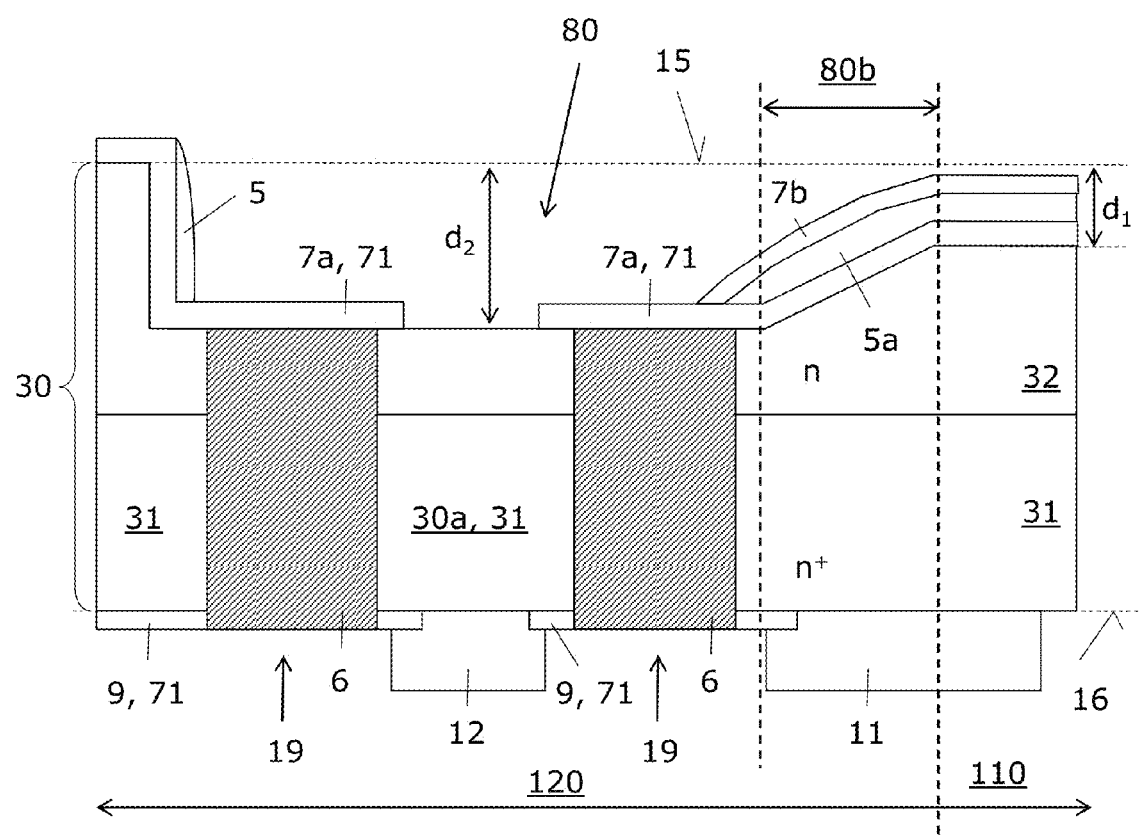
FIG. 4 illustrates, in a vertical cross-section, a semiconductor device according to an embodiment.
Figure 5A:
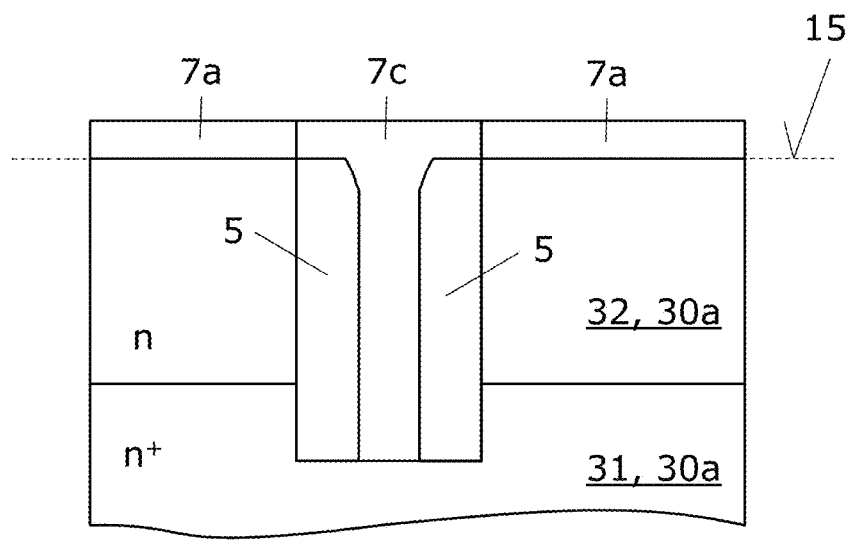
FIGS. 5A and 5B illustrate, in vertical cross-sections, a semiconductor device according to embodiments.
Figure 5B:
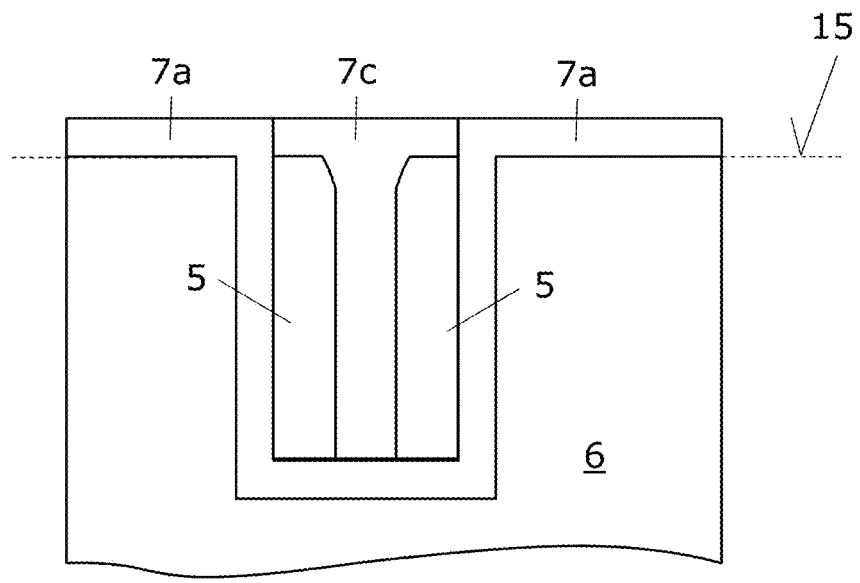

If the horizontal widening of the recess 80 in the active area 120 is larger, the deposited poly-Si for forming the control wiring 5 may only partly fill the recess 80 in the widened portion 80C. This is illustrated in FIG. 4 which corresponds to a vertical cross-section along line AA' of FIG. 1. Depending on the horizontal widening, the control wiring 5 may only be deposited on the sidewall of the field dielectric layer 7a. In these embodiments, an additional filler oxide 7a may, for stability reasons, be used to fill the remaining recess 80. This is illustrated in FIGS. 5A and 5B which correspond to vertical cross-sections through the semiconductor device 105 along line BB' of FIG. 1 and line CC' of FIG. 1, respectively.

With reference to FIG. 6, a further embodiment of a semiconductor device 106 is described. The semiconductor device 106 is similar to the semiconductor device 105 explained above with regard to FIGS. 1 to 5. Accordingly, FIG. 6 typically also corresponds to a vertical cross-section along line AA' through the semiconductor device illustrated in FIG. 1. However, the semiconductor device 106 shown in FIG. 6 has no field plate. The semiconductor device 106 may be manufactured similar as explained for the semiconductor device 105, but without forming the field plate.

Figure 7:
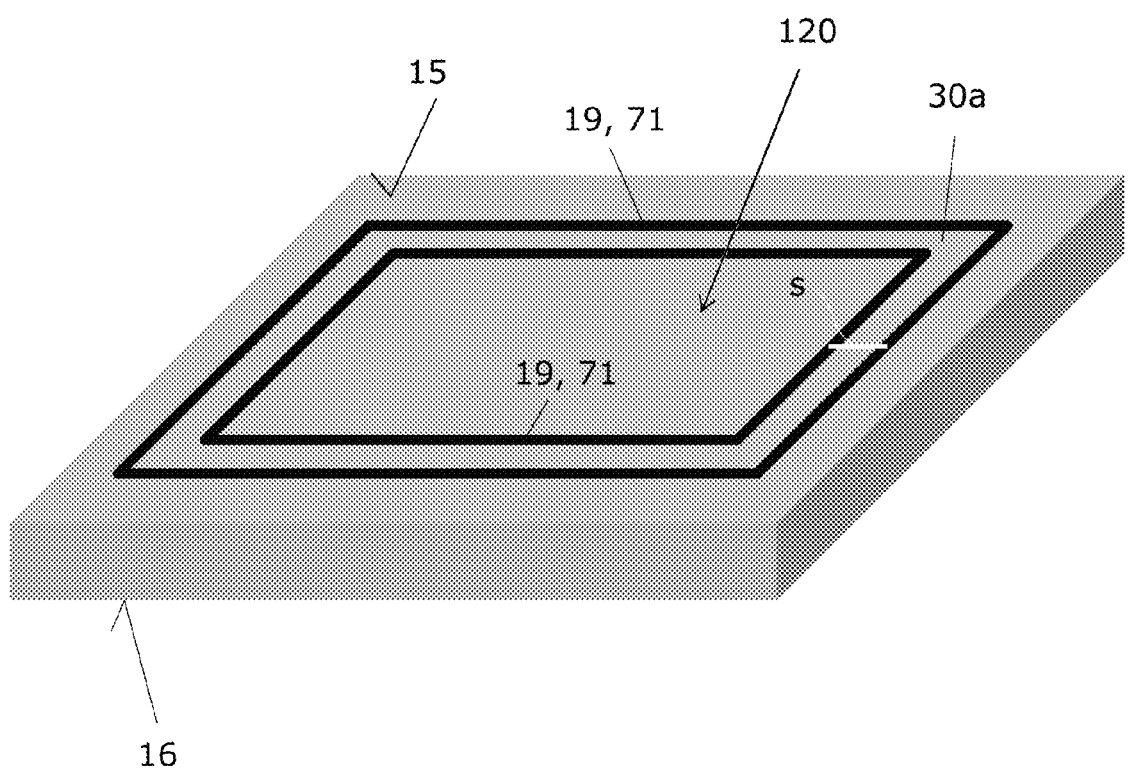
FIG. 7 illustrates, in a schematic view, a semiconductor device according to an embodiment.
Figure 8:
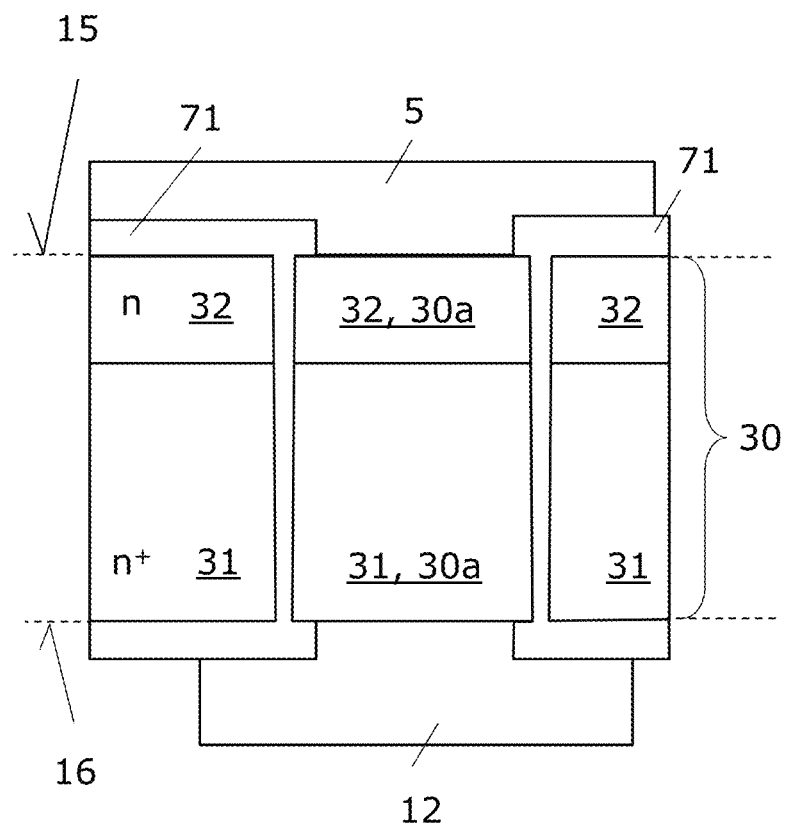
FIG. 8 illustrates, in a vertical cross-section, a semiconductor device according to an embodiment.

As illustrated in FIGS. 7 and 8, the laterally insulated semiconductor mesa 30a used as a through contact of the semiconductor devices 105, 106 typically circumferentially surrounds the active area 110. For example, the laterally insulated semiconductor mesa 30a may be substantially ring-shaped. Whereas FIG. 7 is a schematic perspective view of the semiconductor devices 105, 106 illustrating the layout of the deep vertical trenches 19, FIG. 8 corresponds to a more detailed vertical section along line s of FIG. 7.

Figure 9A:
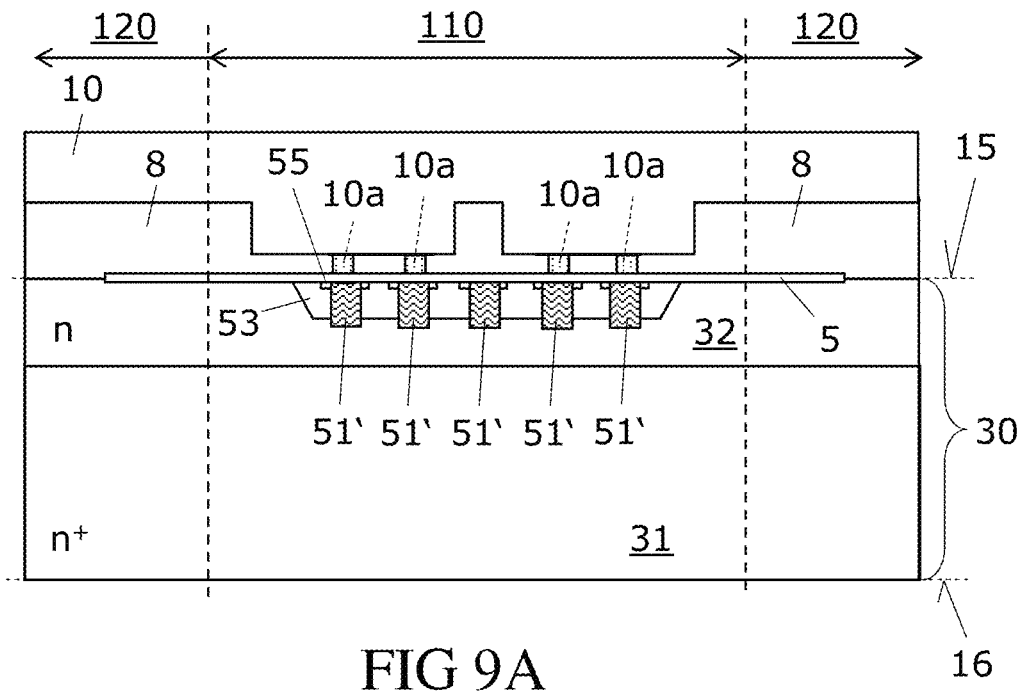
FIGS. 9A, 9B and 10 illustrate processes of a method of manufacturing a semiconductor device according to embodiments.

With regard to the following figures, further methods of forming semiconductor devices are explained. The processes for forming semiconductor devices explained herein have in common that the semiconductor substrate is first processed from its first side 15. This typically includes at least forming transistor structures and a gate wiring 5 next to the first side 15 and a common metallization 10 on top of the semiconductor substrate and on the first side 15. A typical resulting semiconductor device 107 is illustrated in FIG. 9A showing a vertical cross-section through the semiconductor substrate 30. In the exemplary embodiment, five insulated trench gate electrodes 51' extend in the active area 110 from the first side 15 through the source regions 55 and the body regions 53 and partially into a common drift region 32. For sake of clarity, dielectric regions of the MOSFET-structures are not shown in FIGS. 9A, 9B and 10. In addition, the conductive plugs 10a for contacting the respective body regions 53 and source regions 55 with the common source metallization 10 are illustrated. The conductive plugs 10A are insulated from the gate wiring 5 and the contact body regions 53 and the source regions 55 through openings of the gate wiring 5. For sake of clarity, this is also not shown in FIGS. 9A, 9B and 10. The body regions 53 and source regions 55 adjoining the central insulated trench gate electrode 51' are typically contacted with the source metallization 10 in another vertical cross-section.

Thereafter, the semiconductor substrate 30 is mounted with the first side 15 and the common metallization 10, respectively on a carrier system 50. Prior to mounting the semiconductor substrate 30, the common source metallization 10 may be structured. For example, the common source metallization 10 may be removed on cutting lines of a wafer, when several semiconductor devices 107 are manufactured in parallel on the wafer. Accordingly, a later separation of individual chips may be facilitated.

Figure 9B:
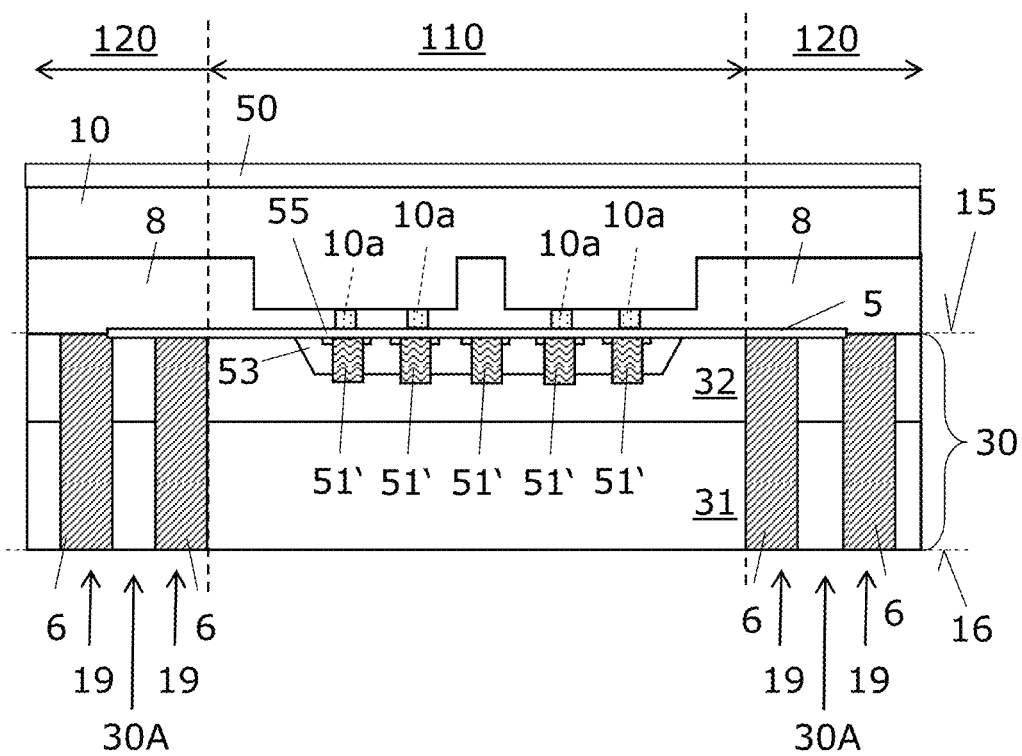

Thereafter, one or more deep vertical trenches 19, for example two deep circumferential vertical trenches 19, are etched in the through contact area 120 from the second side 16 to a field dielectric layer (not shown in FIGS. 9A, 9B and 10) arranged at and/or on the first side 15. At least the sidewalls of the deep vertical trenches 19 are insulated to form a laterally insulated semiconductor mesa 30a in contact with the gate wiring 5. For example, the deep vertical trenches 19 may be filled with a dielectric material 6. The resulting semiconductor device 107 is illustrated in FIG. 9B.

Figure 10:
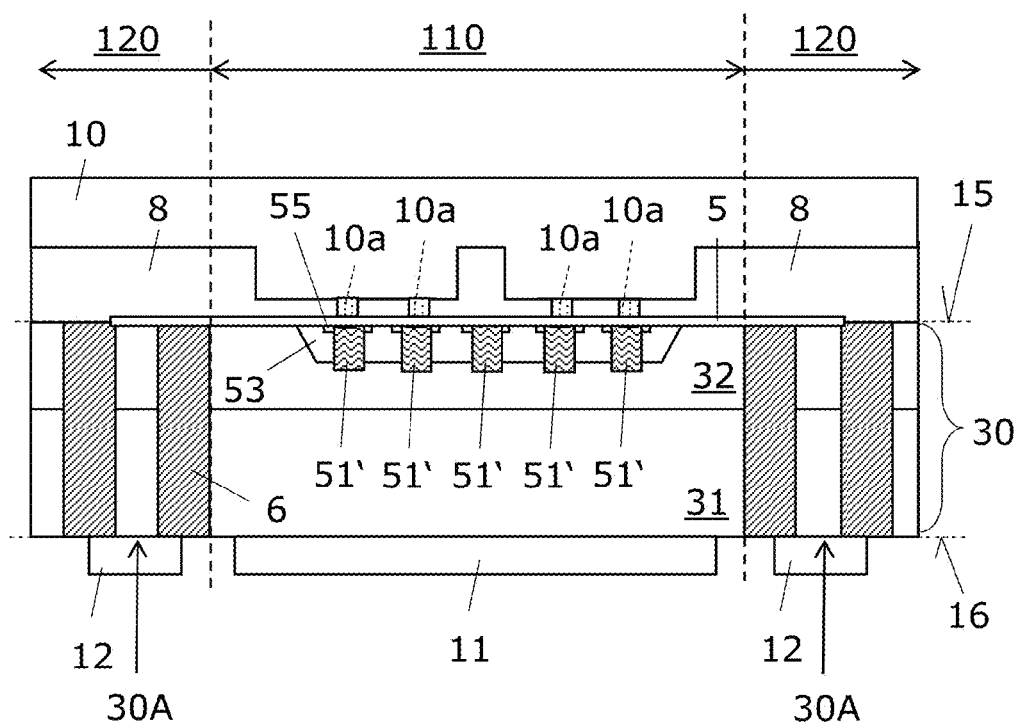

Thereafter, a gate metallization 12 in contact with the semiconductor mesa 30a and a drain metallization 11 in contact with a drain contact region 31 are formed on the second side 16. The resulting semiconductor device 107 is illustrated in FIG. 10 and may be operated as a MOSFET. Accordingly, a common source MOSFET 107 is manufactured in a cost-efficient way.

Typically, only low temperature processes, i.e. processes requiring temperature of less than about 400° are used after mounting the semiconductor substrate 30 on the carrier system 50. Accordingly, transistor structures formed earlier are not exposed to further thermal loads.

With respect to FIGS. 11A to 15B, processes of a method of manufacturing a semiconductor device 100 are explained in more detail. FIGS. 11A to 15B correspond to respective vertical cross-sections through the semiconductor device 100. For sake of clarity, the active area 110 of the semiconductor device 100 is not illustrated in detail in FIGS. 11A to 15B.

Figure 11A:
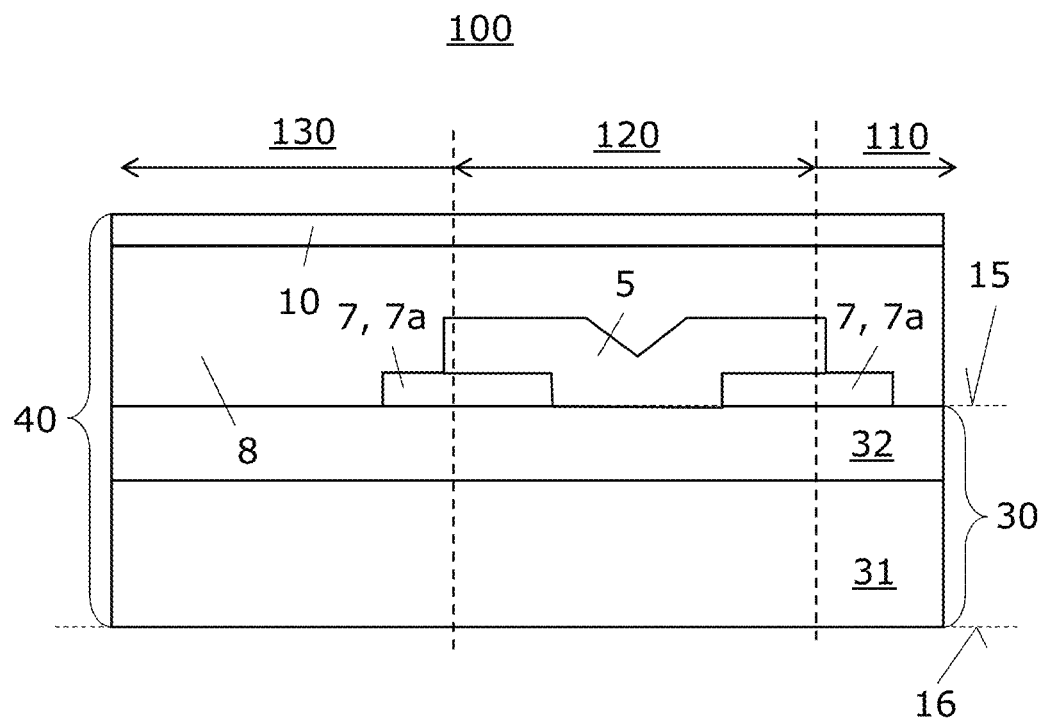
FIG. 11A to 15B illustrate processes of a method of manufacturing a semiconductor device according to embodiments.

In a first process, a wafer 40 is provided. As shown in FIG. 11A, the wafer 40 includes a semiconductor substrate 30 having a first side 15, a second side 16 opposite the first side 15, and a dielectric region 7 on the first side 15 at least in a through contact area 120. The semiconductor substrate 30 may include a common substrate 31 and one or more epitaxial layers 32 arranged on the common substrate 31.

As explained above with regard to FIGS. 1 to 8, a dielectric region 7 may form a field dielectric in the active area 110 of the semiconductor device 100. In addition, a contact layer 5 later forming a gate or control wiring 5, for example a poly-Si layer is arranged on the first side 15 and on the dielectric region 7. In the through contact area 120, the dielectric region 7 is recessed. The gate wiring 5 is formed in ohmic contact with the semiconductor substrate 30 through the recess of dielectric region 7. A further dielectric region 8 typically forming a dielectric interlayer 8 is formed on the first side 15 and contact layer 5. Furthermore, a common metallization 10 is formed on the further dielectric region 8. As explained above, the common metallization 10 may be structured, for example removed in a separation area 130 between different chips of the wafer 40.

Typically, the wafer 40 is finished at the first side 15 prior to processing the wafer 40 at the second side 16. This typically includes forming a transistor structure in the active area 110 of the semiconductor substrate 30 from the first side 15. For example, an insulated gate electrode structure may be formed in the active area 110 on the first side 15 or as a trench gate electrode structure extending form the first side 15 into the semiconductor substrate 30. Furthermore, a field plate may be formed below the insulated gate electrode structure.

After finishing wafer processing from the first side 15, the wafer 40 is mounted with the first side 15 and common metallization 10, respectively, on a carrier system 50, for example glued to a glass-wafer 50. In a subsequent process, the semiconductor substrate 30 may be suitably thinned at the second side 16. This may be done by polishing, etching, grinding, and/or a CMP process.

Figure 11B:
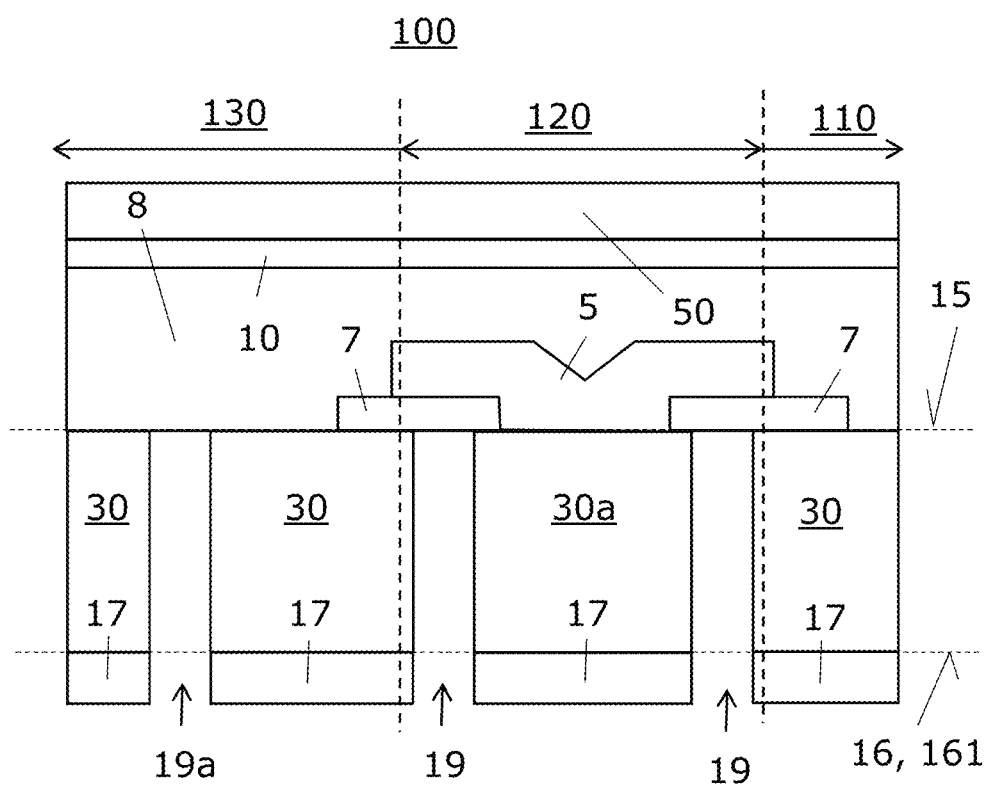

In the through contact area 120, one or more deep vertical trenches 19 are etched from the second side 16 through the semiconductor substrate 30 to the dielectric region 7 acting as etch-stop region for this process. Thereby a semiconductor mesa region 30a later forming a through contact is insulated from the remaining semiconductor substrate 30. The resulting semiconductor structure 100 is shown in FIG. 11B. Typically, the mesa region 30a is arranged between two circumferential deep vertical trenches 19. Furthermore, several mesa regions 30a may be provided per chip when different control electrodes are formed in respective active areas 110.

According to an embodiment, a separation trench 19a is etched in the separation area 130 through the semiconductor substrate 30 to the further dielectric region 8. The deep vertical trenches 19 and the separation trench 19a are typically formed in a common etching process.

Figure 12A:
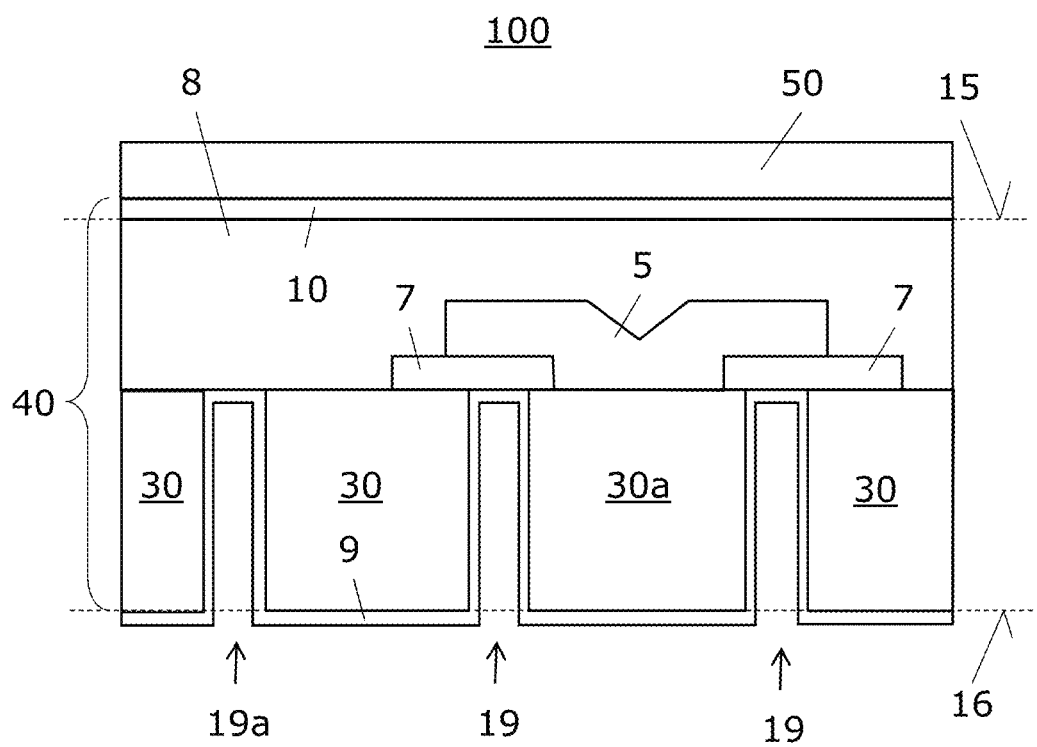

Thereafter, the deep vertical trenches 19 are filled with a dielectric material. For example, a dielectric layer 9 may be formed from the second side 16, for example using a CVD (chemical vapour deposition) process. Accordingly, a conformal layer 9 may be formed which covers the sidewalls and bottom portions of the deep vertical trenches 19 and the second side 16. The resulting semiconductor structure 100 is illustrated in FIG. 12A.

Alternatively, the dielectric layer 9a may be formed as a thermal oxide. In this embodiment, the dielectric layer 9 only covers the sidewalls of the deep vertical trenches 19 and the semiconductor substrate 30, 30a on the second side 16.

Figure 12B:
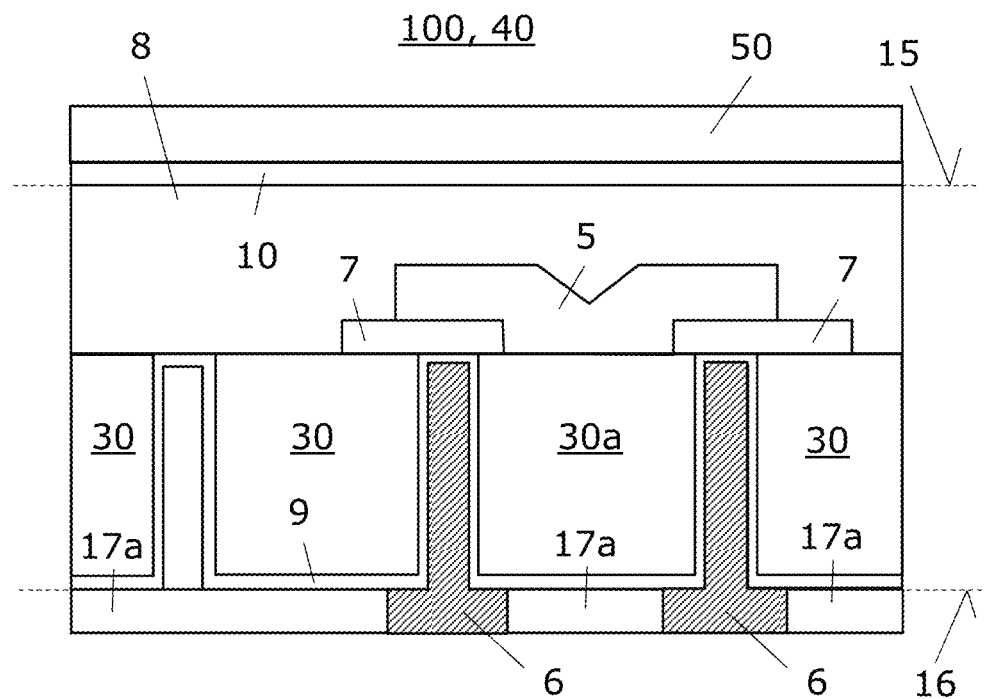

Thereafter, the deep vertical trenches 19 are filled, for example by depositing a polymer from the second side 16, back etching the deposited polymer and/or a CMP-process. For example, a structured mask 17a is formed on the second side 16. The mask 17a typically also covers the separation trench 19a. This is followed by depositing a polymer 6. The resulting semiconductor structure 100 is illustrated in FIG. 12B.

Figure 13A:
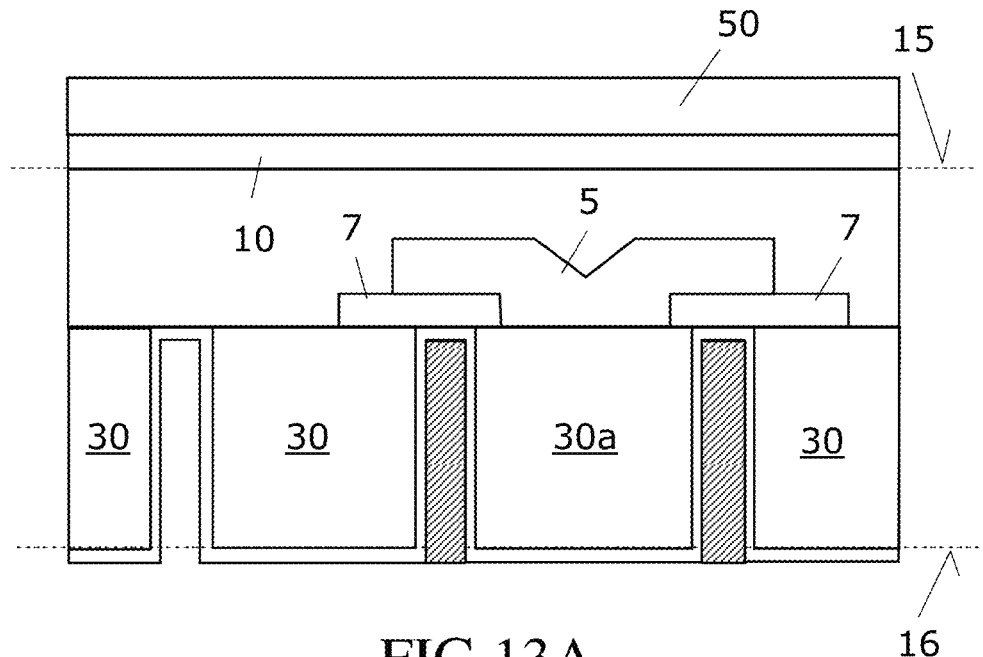

Thereafter, the mask 17A is removed. The protruding portions of the deposited polymer 6 may be etched back and/or removed in a CMP-process. The resulting semiconductor structure 100 is illustrated in FIG. 13A.

In another embodiment, forming the dielectric layer 9 at least on the sidewall of the deep vertical trench 19 may be omitted. Accordingly, the deep vertical trench 19 may be filled with a homogeneous material 6, for example a polymer or an oxide.

Figure 13B:
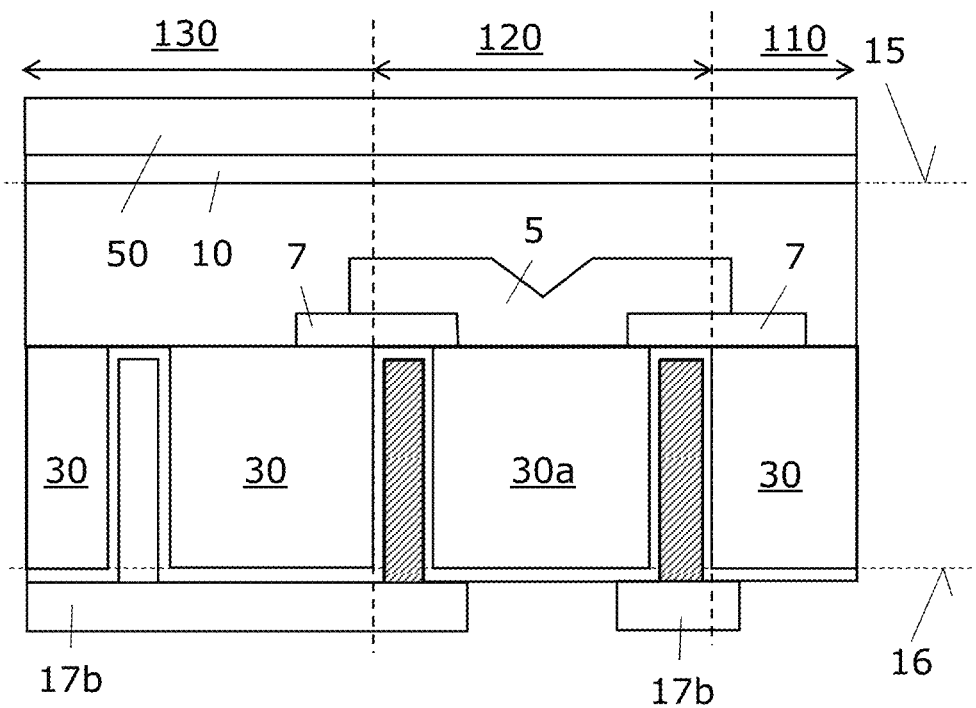

In embodiments in which the dielectric layer 9 is formed on the second side 16, a second mask 17B with openings in the active area 110 and the through contact area 120 is formed on the second side 16. The resulting semiconductor structure 100 is illustrated in FIG. 13B.

Figure 14A:
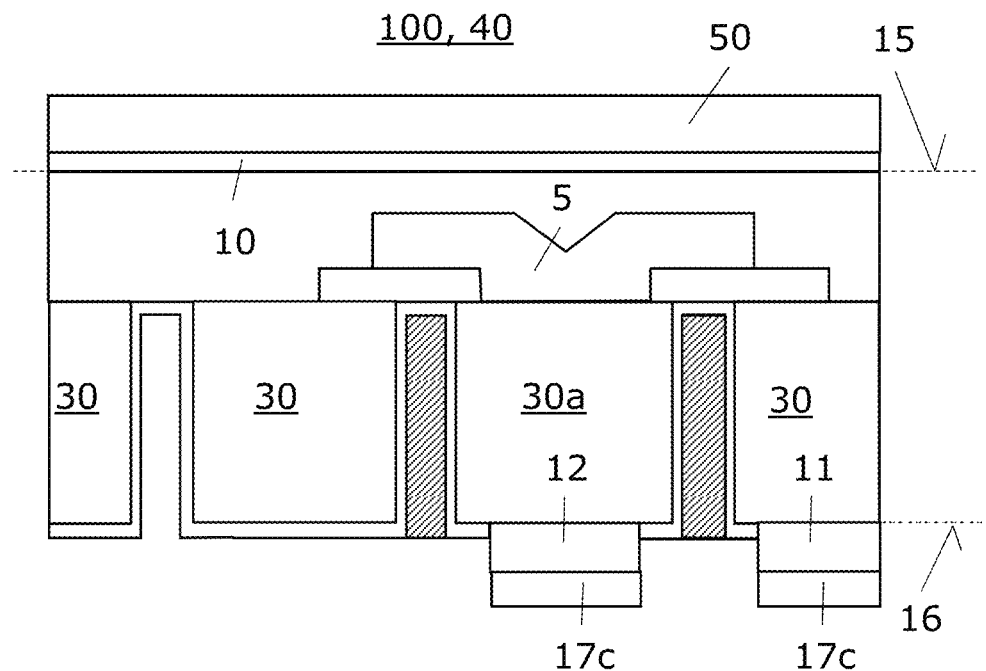

Thereafter, the dielectric layer 9 is etched through the mask 17B to expose the mesa region 30a in the through contact area 120 and the semiconductor substrate 30 in the active area 119 on the second side 16. A common metal layer is typically deposited on the second side 16 and structured using a mask 17c to form a second metallization 12 and a third metallization 11 which are separated from each other. The resulting semiconductor structure 100 is illustrated in FIG. 14A. The second metallization 12 is formed in the through contact area 120 and is in low ohmic contact with a gate electrode of the transistor structure of the active area 110 through the mesa region 30a and the gate wiring 5.

In embodiments in which the transistor structure is a bipolar transistor, the second metallization 12 forms a control electrode which is in low ohmic contact with a base of the bipolar transistor through the mesa region 30a and the control wiring 5. Depending on complexity of chip design, the semiconductor device 100 may also include several mesa regions 30a for connecting different control and/or gate electrodes through the semiconductor substrate 30.

Figure 14B:
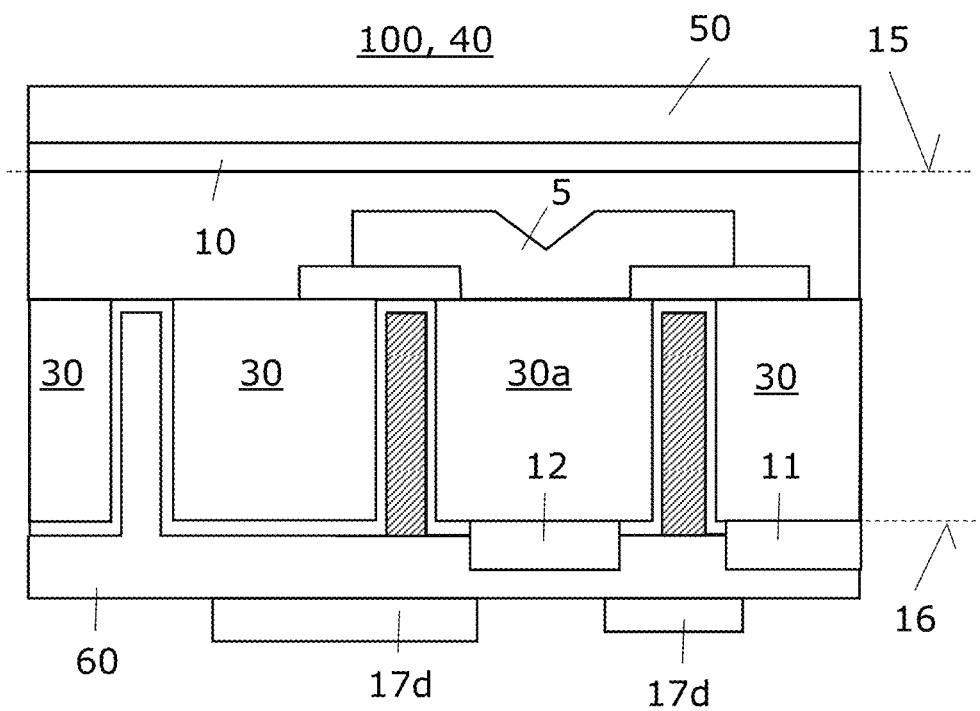

Thereafter, a further dielectric layer 60 is typically deposited on the second side 16 and a further structured mask 17d is formed on the further dielectric layer 60. The resulting semiconductor structure 100 is illustrated in FIG. 14B.

Figure 15A:
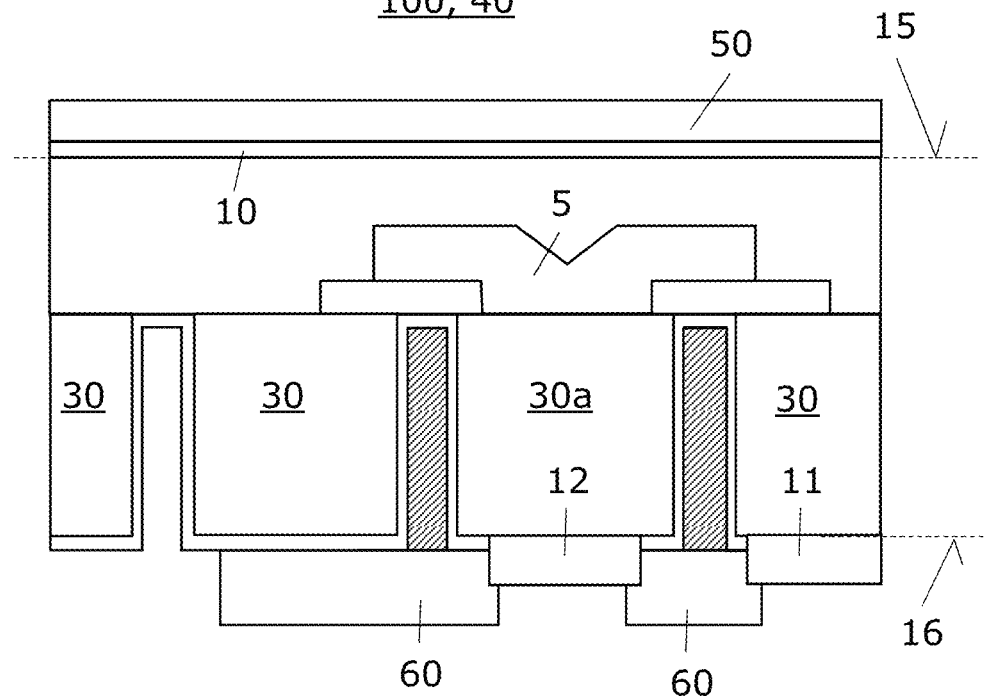

The dielectric layer 60 is etched through the structured mask 17d to form a dielectric structure 60 on the filled deep vertical trenches 19 and between the third metallization 11 and the second metallization 12. The resulting semiconductor structure 100 is illustrated in FIG. 15A. Typically, processing of the semiconductor device 100 at the wafer-level is now finished.

Figure 15B:
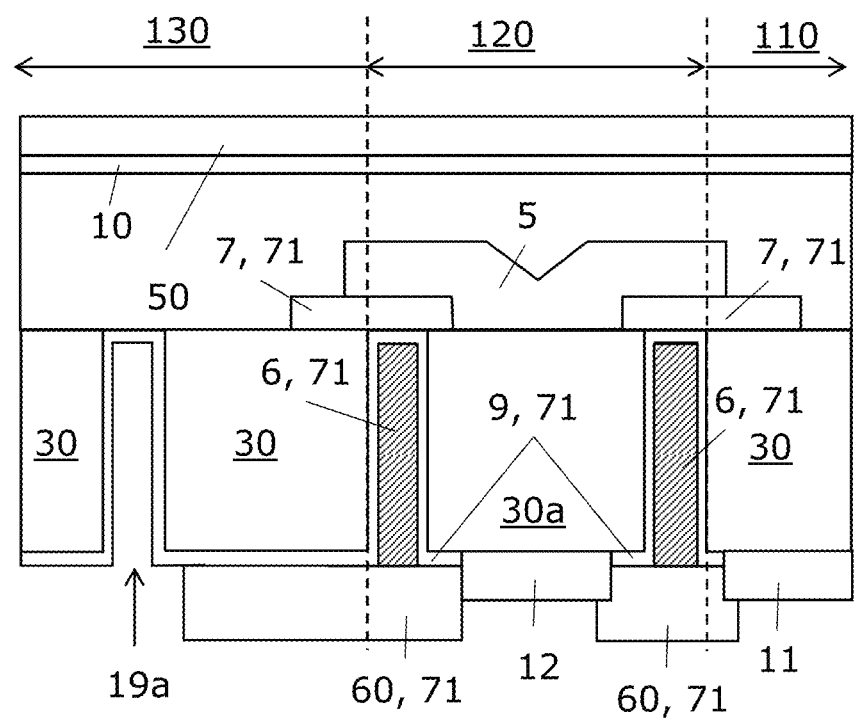

In a subsequent process, the wafer 40 may be separated into individual chips 100 along the separation trench 19a as indicated in FIG. 15B. To facilitate chip separation, the separation trench 19a is not filled during dielectric filling of the deep vertical trenches. Separating the wafer 40 may be done by plasma etching, laser cutting, mechanical breaking and any combination thereof.

Figure 16:
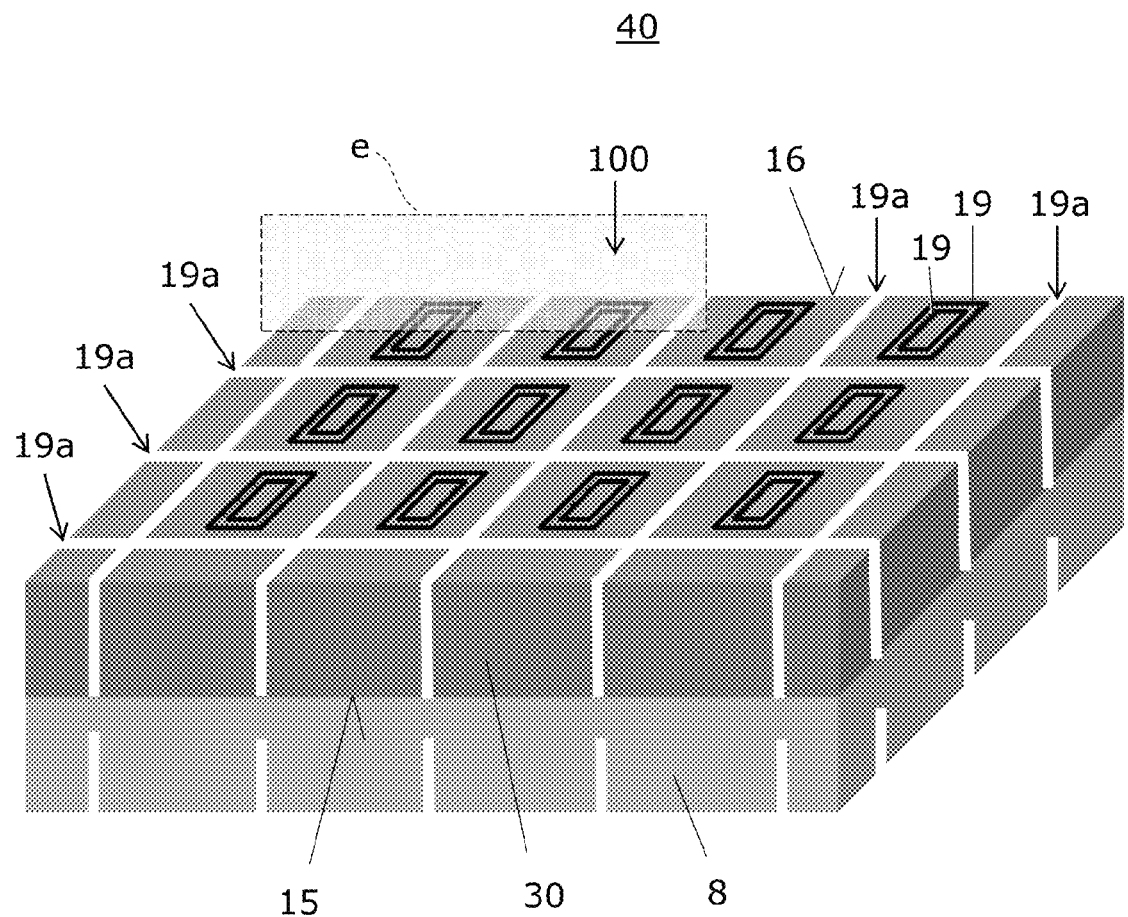
FIGS. 16 and 17 illustrate processes of a method of manufacturing a semiconductor device according to embodiments.

FIG. 16 shows a schematic perspective view of the wafer 40 with a plurality of semiconductor device 100 arranged on an array. The orientation of the wafer 40 is upside down in FIG. 16 compared to the previous Figures. Each semiconductor device 100 has two circumferential deep vertical trenches 19 surrounding a respective semiconductor mesa region forming a through contact. Further, the wafer 40 includes separation trenches 19A between the semiconductor devices 100. For sake of clarity, dielectric regions and metallizations arranged on the second side 16 are not shown in FIG. 16.

Figure 17:
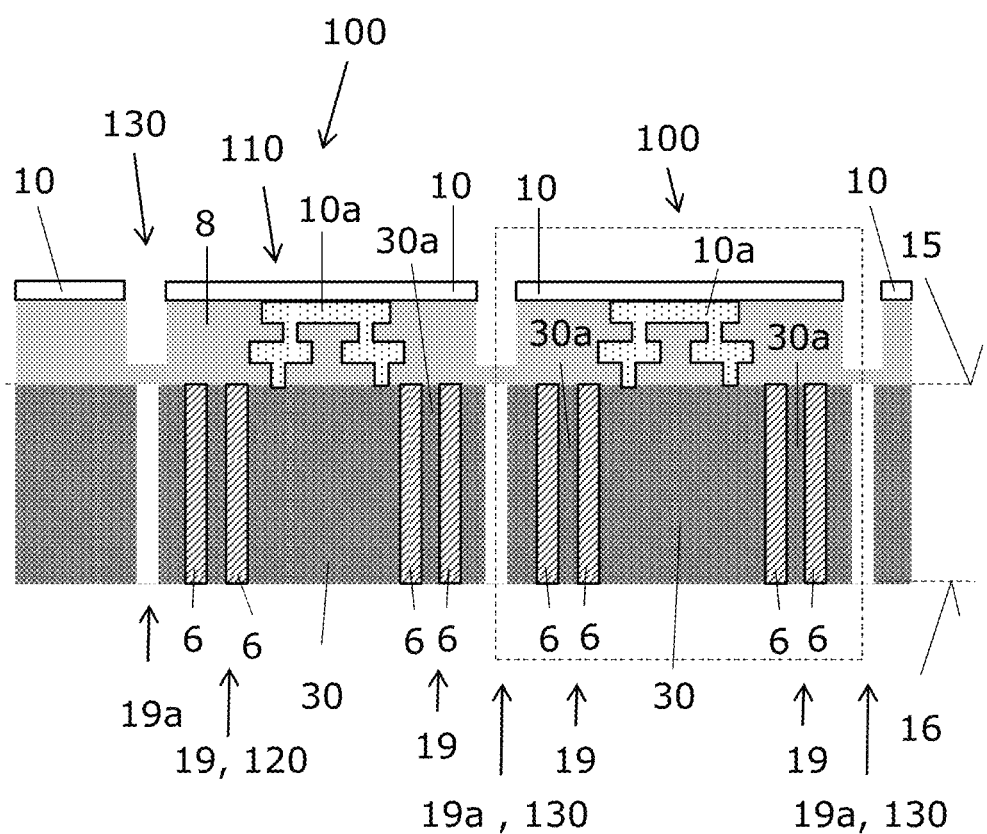

FIG. 17 shows a section of a vertical cross-section through the wafer 40 which corresponds to the plane e of FIG. 16 with two chips 100 to be separated along the separation trenches 19a in the separation areas 130. As explained for FIG. 16, dielectric regions and metallizations arranged on the second side 16 are not shown in FIG. 17. On the first side 15, a common metallization 10 is shown which is in contact with transistor structures in the active area 110 via conductive plugs 10A formed through a dielectric interlayer 8. The common metallization 10 is removed in separation areas 130 to facilitate the subsequent chip separation.

According to an embodiment, a plurality of semiconductor devices 100 are formed by the following processes. A wafer 40 having a plurality of semiconductor structures 100 is provided. A common metallization 10 is formed for the plurality of semiconductor structures on the wafer 40. The common metallization 10 may be structured and removed in separation regions 130, respectively. Thereafter, the wafer 40 is mounted on a carrier system so that the common metallization 10 is covered by the carrier system. Separation trenches 19a are formed through a semiconductor substrate 30 of the mounted wafer 40 and between the plurality of semiconductor structures 100. Finally, the plurality of semiconductor structures 100 are separated along the separation trenches 19a, for example by plasma etching, laser cutting, and/or mechanical breaking.

The separation trenches 19a are typically formed by plasma etching. Alternatively and/or in addition, the separation trenches 19a are formed by wet chemical etching.

According to an embodiment, the separation trenches 19a are formed together with at least one deep vertical trench 19 defining a semiconductor mesa region. For stability reasons, the at least one deep vertical trench 19 is typically filled with a dielectric material while the separation trenches 19a are masked to facilitate later chip separation. Thereby, the semiconductor mesa region is laterally insulated to form a through contact for a control electrode. Prior to separating the semiconductor structures 100 into individual semiconductor devices 100, a control metallization in ohmic contact with the at least one laterally insulated mesa region and arranged opposite the common metallization is formed.

It is to be understood that the features of the various exemplary embodiments described herein may be combined with each other, unless specifically noted otherwise.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising:
    providing a wafer comprising:
        a semiconductor substrate having a first side and a second side opposite the first side; and
        a dielectric region on the first side;
    forming a further dielectric region on the first side;
    mounting the wafer with the first side on a carrier system;
    etching a deep vertical trench from the second side through the semiconductor substrate to the dielectric region, thereby insulating a semiconductor mesa region from the remaining semiconductor substrate;
    etching a separation trench through the semiconductor substrate at least close to the further dielectric region;
    masking the separation trench; and
    filling the deep vertical trench with a dielectric material after masking the separation trench.

2. The method of claim 1, wherein mounting the wafer with the first side on a carrier system comprises attaching the wafer to a glass substrate.

3. The method of claim 1, further comprising prior to mounting the wafer at least one of:
    forming a transistor structure in the semiconductor substrate;
    forming a gate electrode structure on the first side;
    forming a trench gate electrode structure extending form the first side into the semiconductor substrate; and
    forming a field plate below the gate electrode structure or the trench the gate electrode structure.

4. The method of claim 1, further comprising at least one of:
    forming on the second side a metallization in low resistive contact with a gate electrode of a gate electrode structure or a trench gate electrode structure through the semiconductor mesa region;
    forming on the second side an additional metallization in low resistive contact with a semiconductor body; and,
    forming a dielectric structure on the filled deep vertical trench and between the metallizations.

5. The method of claim 1, further comprising prior to mounting the wafer at least one of:
    forming a contact layer in ohmic contact with the semiconductor mesa region on the first side;
    forming a first metallization on the further dielectric region; and
    structuring the first metallization.

6. The method of claim 1, further comprising processing the second side to thin the semiconductor substrate prior to etching the deep vertical trench.

7. The method of claim 6, wherein processing the second side comprises at least one of polishing, etching, grinding, and a CMP process.

8. The method of claim 1, wherein filling the deep vertical trench with a dielectric material comprises at least one of forming a dielectric layer at least on a sidewall of the deep vertical trench, depositing a polymer, back etching the deposited polymer and a chemical-mechanical polishing process.

9. The method of claim 8, wherein the dielectric layer is formed as a conformal dielectric layer.

10. The method of claim 1, further comprising separating the wafer along the separation trench.

11. The method of claim 10, wherein separating the wafer along the separation trench comprises at least one of mechanical breaking, laser cutting, and plasma etching.

12. A method of forming a plurality semiconductor devices, comprising:
    providing a wafer comprising a semiconductor substrate comprising a plurality of semiconductor structures;
    forming a first metallization for the plurality of semiconductor structures on the wafer;
    mounting the wafer on a carrier system so that the first metallization is covered by the carrier system;

forming separation trenches through the semiconductor substrate of the mounted wafer and between the plurality of semiconductor structures together with at least one deep vertical trench;

filling the at least one deep vertical trench with a dielectric material while the separation trenches are masked, thereby forming at least one laterally insulated semiconductor mesa region; and separating the plurality of semiconductor structures along the separation trenches.

13. The method of claim 12, wherein forming the separation trenches comprises plasma etching.

14. The method of claim 12, further comprising forming a control metallization in low resistive contact with the at least one laterally insulated semiconductor mesa region and arranged opposite the first metallization.

15. A method of forming a semiconductor device, comprising:

providing a semiconductor substrate comprising a first side and a second side opposite the first side;

defining an active area and a through contact area;

forming a recess from the first side into the semiconductor substrate such that the recess comprises in the through contact area a horizontally widening portion;

forming a first dielectric layer on the recess;

opening the first dielectric layer in the through contact area;

mounting the semiconductor substrate with the first side on a carrier system;

etching in the through contact area from the second side two deep circumferential vertical trenches through the semiconductor substrate to the first dielectric layer; and insulating at least the sidewalls of the two deep circumferential vertical trenches to form a laterally insulated semiconductor mesa.

16. The method of claim 15, wherein the recess is formed by masked etching such that the recess extends in the active area to a first vertical depth and in the through contact area to a second vertical depth which is larger than the first vertical depth.

17. The method of claim 15, further comprising forming a conformal layer of a conductive material in the recess so that the recess is completely filled in the active area.

18. The method of claim 17, further comprising back-etching the conformal layer to form a field electrode in the active area.

19. The method of claim 18, further comprising at least one of forming a second dielectric layer on the field electrode, depositing a conductive material on the recess in ohmic contact with the semiconductor mesa, back-etching of the conductive material to form a gate electrode, and forming a control metallization on the second side in ohmic contact with the semiconductor mesa and the gate electrode.

* * * * *

UNITED STATES PATENT AND TRADEMARK OFFICE
CERTIFICATE OF CORRECTION

PATENT NO. : 8,735,262 B2  Page 1 of 1
APPLICATION NO. : 13/279846
DATED : May 27, 2014
INVENTOR(S) : H. Gruber et al.

It is certified that error appears in the above-identified patent and that said Letters Patent is hereby corrected as shown below:

In the Claims:

Column 14, line 19 (claim 3, line 6), please change "extending form" to -- extending from --

Column 14, line 22 (claim 3, line 9), please change "the trench the gate" to -- the trench gate --

Signed and Sealed this
Ninth Day of September, 2014

Michelle K. Lee
*Deputy Director of the United States Patent and Trademark Office*